United States Patent
Wong et al.

(10) Patent No.: US 9,837,523 B2
(45) Date of Patent: Dec. 5, 2017

(54) TINED GATE TO CONTROL THRESHOLD VOLTAGE IN A DEVICE FORMED OF MATERIALS HAVING PIEZOELECTRIC PROPERTIES

(71) Applicant: Synopsys, Inc., Mountain View, CA (US)

(72) Inventors: Hiu Y. Wong, Cupertino, CA (US); Nelson de Almeida Braga, Santa Clara, CA (US); Rimvydas Mickevicius, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/098,164

(22) Filed: Apr. 13, 2016

(65) Prior Publication Data

US 2017/0186860 A1 Jun. 29, 2017

Related U.S. Application Data

(60) Provisional application No. 62/387,338, filed on Dec. 23, 2015.

(51) Int. Cl.
*H01L 29/15* (2006.01)
*H01L 29/778* (2006.01)
(Continued)

(52) U.S. Cl.
CPC ...... *H01L 29/7787* (2013.01); *G06F 17/5072* (2013.01); *H01L 29/66462* (2013.01)

(58) Field of Classification Search
CPC .............. H01L 29/7787; H01L 29/778; H01L 29/66462; H01L 29/66613; H01L 29/66704; G06F 17/5072
(Continued)

(56) References Cited

U.S. PATENT DOCUMENTS 5,698,888 A * 12/1997 Fukaishi ........... H01L 29/42316
257/192
8,987,813 B2 * 3/2015 Lee ..................... H01L 29/4236
257/330

(Continued)

OTHER PUBLICATIONS

Ota et al., "A Normally-off GaN FET with High Threshold Voltage Uniformity Using a Novel Piezo Neutralization Technique," 2009 IEEE IEDM09, pp. 153-156.

(Continued)

*Primary Examiner* — Tu-Tu Ho
(74) *Attorney, Agent, or Firm* — Haynes Beffel & Wolfeld LLP

(57) ABSTRACT

Roughly described, a field effect transistor has a first piezoelectric layer supporting a channel, a second piezoelectric layer over the first piezoelectric layer, a dielectric layer having a plurality of dielectric segments separated by a plurality of gaps, the dielectric layer over the second piezoelectric layer, and a gate having a main body and a plurality of tines. The main body of the gate covers at least one dielectric segment of the plurality of dielectric segments and at least two gaps of the plurality of gaps. The plurality of tines have proximal ends connected to the main body of the gate, middle portions projecting through the plurality of gaps, and distal ends separated from the first piezoelectric layer by at least the second piezoelectric layer. The dielectric layer exerts stress, creating a piezoelectric charge in the first piezoelectric layer, changing the threshold voltage of the transistor.

41 Claims, 13 Drawing Sheets

(51) Int. Cl.
*H01L 29/66* (2006.01)
*G06F 17/50* (2006.01)

(58) Field of Classification Search
USPC .................................................. 257/76, 401
See application file for complete search history.

(56) References Cited

U.S. PATENT DOCUMENTS

| | | | |
|---|---|---|---|
| 2007/0162268 A1* | 7/2007 | Kota .................. | G06F 17/5045 703/14 |
| 2007/0228416 A1* | 10/2007 | Chen .................. | H01L 21/8252 257/192 |
| 2008/0079023 A1* | 4/2008 | Hikita ................ | H01L 29/1066 257/192 |
| 2008/0283870 A1 | 11/2008 | Sato | |
| 2012/0126287 A1* | 5/2012 | Aoki ................... | H01L 29/402 257/192 |
| 2013/0214283 A1 | 8/2013 | Briere et al. | |
| 2013/0313612 A1 | 11/2013 | Khalil et al. | |
| 2013/0326438 A1 | 12/2013 | Lee et al. | |
| 2015/0021667 A1 | 1/2015 | Liu et al. | |

OTHER PUBLICATIONS

Uemoto et al., "Gate Injection Transistor (GIT)—a Normally-Off AlGaN/GaN Power Transistor Using Conductivity Modulation," IEEE Transactions on Electron Devices, vol. 54, No. 12, Dec. 2007, pp. 3393-3399.

Saito et al., "Recessed-Gate Structure Approach Toward Normally Off High-Voltage AlGaN/GaN HEMT for Power Electronics Applications," IEEE Transactions on Electron Devices, vol. 53, No. 2, Feb. 2006, pp. 356-362.

Im et al., "High Performance GaN-Based Nanochannel FinFETs With/Without AlGaN/GaN Heterostructure," IEEE Transactions on Electron Devices, vol. 60, No. 10, Oct. 2013, pp. 3012-3018.

Shigekawa et al., "Analysis of Passivation-Film-Induced Stress Effects on Electrical Properties in AlGaN/GaN HEMT's," Paper— Special Section on Heterostructure Microelectronics with TWHM 2009, IEICE Trans, Electron, vol. E93-C, No. 8, Aug. 2010, pp. 1212-1217.

Lu et al., "Tri-Gate Normally-Off GaN Power MISFET," IEEE Electron Device Letters, vol. 33, No. 3, Mar. 2012, pp. 360-362.

Wang et al., "Enhancement-Mode Si3N4/AlGaN/GaN MISHFETs," IEEE Electron Device Letters, vol. 27, No. 10, Oct. 2006, pp. 793-795.

Besland et al., "Interpretation of stress variation in silicon nitride films deposited by electron cyclotron resonance plasma," HAL archives-ouvertes, J. Vac. Sci. Technol. A22(5), , Sep./Oct. 2004, American Vacuum Society, pp. 1962-1970.

Jin et al., "Total Current Collapse in High-Voltage GaN MIS- HEMTs Induced by Zener Trapping." Electron Devices Meeting (IEDM), 2013 IEEE International. IEEE, 2013, 4 pages.

PCT/US2016/067750—International Search Report and Written Opinion dated Apr. 11, 2017, 16 pages.

* cited by examiner

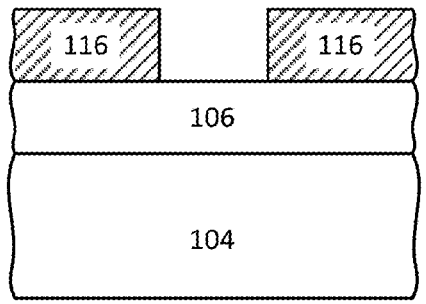 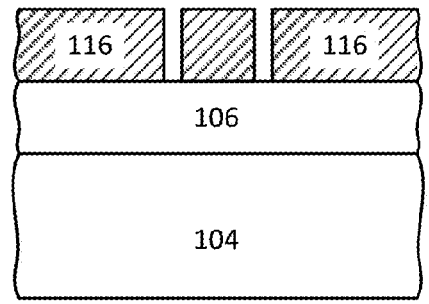
FIG. 11A　　　　　　　　FIG. 11B
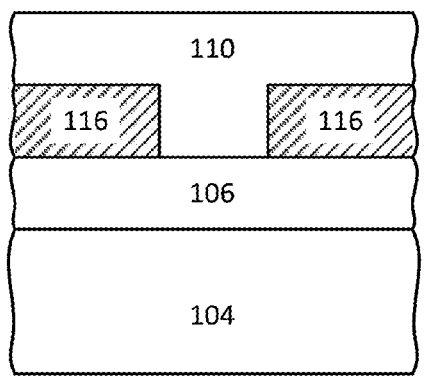 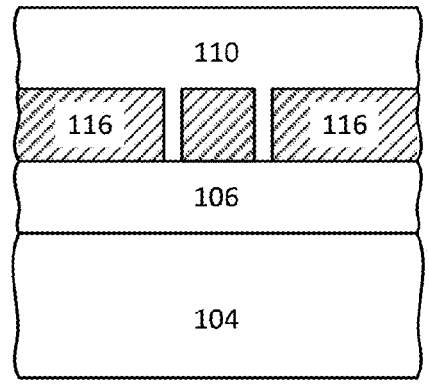
FIG. 12A　　　　　　　　FIG. 12B
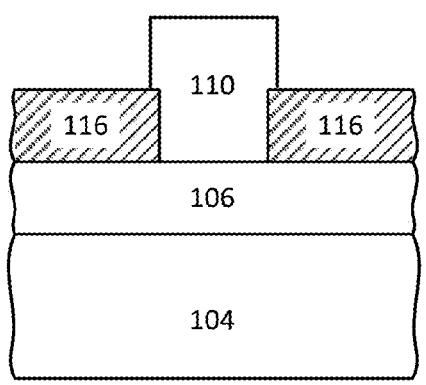 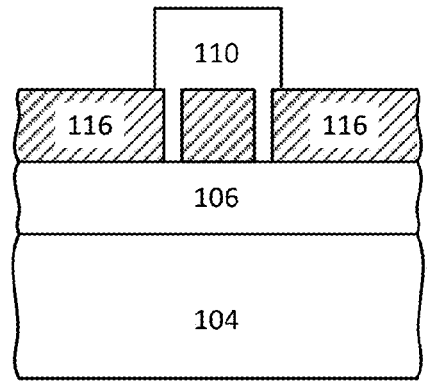
FIG. 13A　　　　　　　　FIG. 13B

TINED GATE TO CONTROL THRESHOLD VOLTAGE IN A DEVICE FORMED OF MATERIALS HAVING PIEZOELECTRIC PROPERTIES

BACKGROUND

The present technology relates to heterojunction field effect transistors (HFETs) (including high electron mobility transistors (HEMTs) or metal-insulator-semiconductor-HFETs (MISHFETs) or double-channel HFETs/HEMTs/MISHFETs or dual-Channel HFETs/HEMTs/MISHFETs, or thin-body (SOI, finFET, tri-gate, gate-all-around, etc.) HFETs/HEMTs/MISHFETs), which may be used, for example, as switching devices. Such devices are typically formed of III-V semiconductors and achieve very high mobility by having an undoped channel region. In conventional HFETs, the device is described as "normally on"; i.e. the threshold voltage, also referred to as pinch-off voltage, is zero or negative, and the channel conducts electric current with little or no bias applied between source and gate. For power electronics applications, a normally off device is strongly preferred, for safety, energy conversion and circuit design reasons. For example, a normally on device will allow a significant amount of power to flow between source and drain in the event of a failure leading to a floating or grounded gate terminal.

Approaches have been tried to change the threshold voltage of a HFET. In "Recessed-Gate Structure Approach Toward Normally Off High-Voltage AlGaN/GaN HEMT for Power Electronics Applications," Saito et al., IEEE Transaction on Electron Devices, Vol. 53, No. 2, February, 2006, pp. 356-362, the authors describe thinning the barrier under the gate to increase the threshold voltage. This approach increases fabrication complexity, requiring extra etching and cleaning steps, and etch damage may result. The thinner barrier and etch damage increase gate leakage. The etch may not be uniform, so the resulting devices may not have uniform threshold voltages.

"A Normally-off GaN FET with High Threshold Voltage Uniformity Using a Novel Piezo Neutralization Technique," Ota et al., IEDM 2009, pp. 153-156, describes a recessed-gate HFET in which a "piezo neutralization (PNT) layer" is formed at the bottom of the gate recess to improve threshold voltage uniformity. Formation of the PNT layer increases fabrication complexity and cost significantly, requiring formation by metal organic chemical vapor deposition (MOCVD) of three rather than one barrier layer of $Al_xGa_{1-x}N$, barrier etch, and atomic layer deposition of a gate oxide.

"Enhancement-Mode $Si_3N_4$/AlGaN/GaN MISHFETs," Wang et al., IEEE Electron Device Letters, Vol. 27, No. 10, October 2006, pp. 793-795, describes a method in which plasma treatment of the gate and a two-step $Si_3N_4$ deposition process increase threshold voltage. The plasma treatment will cause damage, and fabrication is more complex.

"Gate Injection Transistor (GIT)—A Normally-Off AlGaN/GaN Power Transistor Using Conductivity Modulation," Uemoto et al., IEEE Trans Electron Dev, 54(2007), p. 3393, describes an HFET using hole injection from a p-AlGaN gate to the AlGaN/GaN heterojunction to increase threshold voltage. As in the other approaches, extra deposition, etching, and cleaning steps are required, increasing device complexity and cost.

It is desirable to change the threshold voltage of a device without significantly increasing device cost and complexity. Altering threshold voltage in order to produce an HFET that is normally off, or altering threshold voltage in some other way, may be advantageous.

SUMMARY

The technology disclosed herein relates to a field effect transistor having a tined gate.

A field effect transistor is described herein. The field effect transistor comprises a first piezoelectric layer supporting a channel, a second piezoelectric layer over the first piezoelectric layer, a dielectric layer having a plurality of dielectric segments separated by a plurality of gaps, the dielectric layer over the second piezoelectric layer, and a gate having a main body and a plurality of tines. The main body of the gate covers at least one dielectric segment of the plurality of dielectric segments and covers at least two gaps of the plurality of gaps, the plurality of tines having proximal ends connected to the main body of the gate, middle portions projecting through the plurality of gaps, and distal ends separated from the first piezoelectric layer by at least the second piezoelectric layer.

In embodiments, the first piezoelectric layer is substantially a crystalline III-V semiconductor, as is the second piezoelectric layer, such as, for example, a group III-nitride semiconductor. In embodiments, the first piezoelectric layer and the second piezoelectric layer contact at a heterojunction. In some embodiments, the field effect transistor further comprises a source electrically coupled to the second piezoelectric layer and a drain electrically coupled to the second piezoelectric layer. The channel is non-conducting when there is a voltage difference between the source and the drain and there is no voltage applied between the gate and the source or the gate and the drain.

Also described herein is a method to modify a mask set used to fabricate a heterojunction field effect transistor. The method comprises replacing a first mask or masks of the mask set with a second mask or masks. A first heterojunction field effect transistor made using the first mask or masks comprises: a first transistor buffer layer supporting a first transistor channel, a first transistor barrier layer over the first transistor buffer layer, wherein the first transistor barrier layer and the first transistor buffer layer both have piezoelectric properties, the first transistor dielectric layer divided by a gate opening, the first transistor dielectric layer over the second transistor barrier layer, and a first transistor gate disposed in the gate opening. A second heterojunction field effect transistor made using the second mask or masks comprises: a second transistor buffer layer supporting a second transistor channel, a second transistor barrier layer over the second transistor buffer layer, wherein the second transistor barrier layer and the second transistor buffer layer both have piezoelectric properties, the second transistor dielectric layer having a plurality of dielectric segments separated by a plurality of gaps, the second transistor dielectric layer over the second transistor barrier layer, and a second transistor gate having a main body and a plurality of tines, the main body of the second transistor gate covering at least one dielectric segment of the plurality of dielectric segments and covering at least two gaps of the plurality of gaps, the plurality of tines having proximal ends connected to the main body of the gate, middle portions projecting through the plurality of gaps, and distal ends separated from the second transistor buffer layer by at least the second transistor barrier layer, each tine having a width, measured parallel to a direction of current flow in the channel, of less than 200 nm. The first transistor has a first threshold voltage and the second transistor has a second threshold voltage, and the replacing step serves to cause the second threshold voltage to be different from the first threshold voltage. In embodiments, the first transistor barrier and the first transistor buffer contact at a first transistor heterojunction, and the second transistor barrier and the second transistor buffer contact at a second transistor heterojunction. The second threshold voltage is greater or less than the first threshold voltage by at least 0.1 volt, for example at least 0.5 volt.

A method for modifying a designed threshold voltage of a heterojunction field effect transistor is described herein. The method comprises the steps of a) providing an original layout for an original heterojunction field effect transistor in dependence upon a provided circuit design for the original transistor, the original transistor having a first piezoelectric layer supporting a channel, a second piezoelectric layer over the first piezoelectric layer, an original dielectric layer divided by a gate opening, the original dielectric layer over the second piezoelectric layer, and an original gate disposed in the gate opening; and b) using EDA software, modifying the original layout to produce a modified layout by: i) replacing the original dielectric layer with a modified dielectric layer having a plurality of dielectric segments separated by a plurality of gaps, and ii) replacing the original gate with a modified gate, wherein the modified gate has a main body and a plurality of tines, the main body of the modified gate covering at least one dielectric segment of the plurality of dielectric segments and covering at least two gaps of the plurality of gaps, the plurality of tines having proximal ends connected to the main body of the modified gate, middle portions projecting through the plurality of gaps, and distal ends separated from the first piezoelectric layer by at least the second piezoelectric layer, each tine having a width, measured parallel to a direction of current flow in the channel, of less than 200 nm. A modified heterojunction field effect transistor produced using the modified layout has a modified threshold voltage and the original heterojunction field effect transistor produced using the original layout has an original threshold voltage, the modified threshold voltage different from the original threshold voltage.

Also described herein is a computer readable medium having stored thereon, in a non-transitory manner, a plurality of software code portions defining logic for modifying a designed threshold voltage of a heterojunction field effect transistor by: a) being provided an original layout for an original heterojunction field effect transistor in dependence upon a provided circuit design for the original transistor, the original transistor having a first piezoelectric layer supporting a channel, a second piezoelectric layer over the first piezoelectric layer, an original dielectric layer divided by a gate opening, the original dielectric layer over the second piezoelectric layer, and an original gate disposed in the gate opening; and b) modifying the original layout to produce a modified layout by: i) replacing the original dielectric layer with a modified dielectric layer having a plurality of dielectric segments separated by a plurality of gaps, and ii) replacing the original gate with a modified gate, wherein the modified gate has a main body and a plurality of tines, the main body of the modified gate covering at least one dielectric segment of the plurality of dielectric segments and covering at least two gaps of the plurality of gaps, the plurality of tines having proximal ends connected to the main body of the modified gate, middle portions projecting through the plurality of gaps, and distal ends separated from the first piezoelectric layer by at least the second piezoelectric layer, each tine having a width, measured parallel to a direction of current flow in the channel, of less than 200 nm. A modified heterojunction field effect transistor produced using the modified layout has a modified threshold voltage and the original heterojunction field effect transistor produced using the original layout has an original threshold voltage, the modified threshold voltage different from the original threshold voltage.

BRIEF DESCRIPTION OF THE DRAWINGS

FIGS. 11a, 12a, and 13a illustrate stages in fabrication of an HFET having a conventional gate, while FIGS. 11b, 12b, and 13b illustrate the same stages in fabrication of an HFET having a gate with two tines.

DETAILED DESCRIPTION

Figure 1:
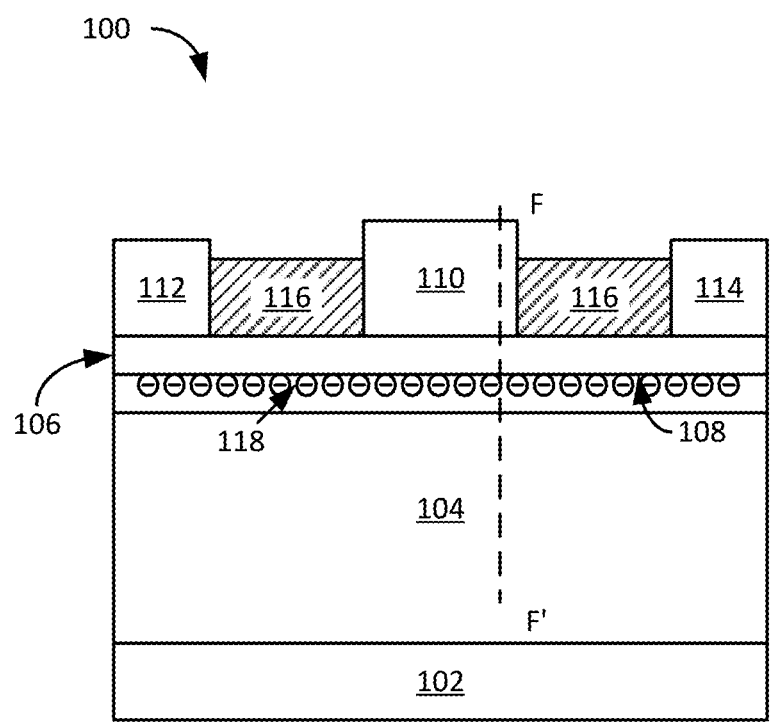
FIG. 1 illustrates a conventional HFET device.

FIG. 1 shows a conventional HFET device 100. Substrate 102 is a crystalline semiconductor substrate, for example a silicon, silicon carbide, gallium nitride or sapphire wafer. Buffer 104 is typically formed of a crystalline III-V semiconductor material, for example a group III-nitride material, for example GaN. As will be seen, buffer 104 supports a channel 118 under suitable bias voltages. Barrier 106 is a different III-V semiconductor material having a wider band gap than the material of buffer 104, and may be, for example, $Al_xGa_{1-x}N$ where x may vary from, for example, about 0.1 to about 1. Barrier 106 and buffer 104 thus meet at heterojuction 108. Buffer 104 and barrier 106 are both piezoelectric layers, formed of materials having piezoelectric properties. Gate 110 is typically formed of a metal, for example a NiAu bilayer or alloy, that will form a Schottky barrier with barrier 106. Source 112 and drain 114 are electrically coupled to barrier 106, and are formed of a conductive material which forms an ohmic contact with barrier 106, for example TiN, metal layers such as Ti/Al/Ni/Au, or some other suitable material or combination of materials. Passivation layer 116 is conventionally silicon nitride, but may be some other dielectric material. Buffer 104 and barrier 106 are generally epitaxially grown from a seed layer, typically of AlN (not shown) deposited on substrate 102. In order to maximize electron mobility in channel region 118, buffer 104 and barrier 106 are not intentionally doped, thus avoiding collisions with ionized dopant atoms, i.e. impurity scattering.

Polarization charge at the interface of barrier 106 and buffer 104 (at heterojunction 108) creates a layer of high-mobility electrons known as a two-dimensional electron gas (2DEG) at channel region 118.

Figure 2:
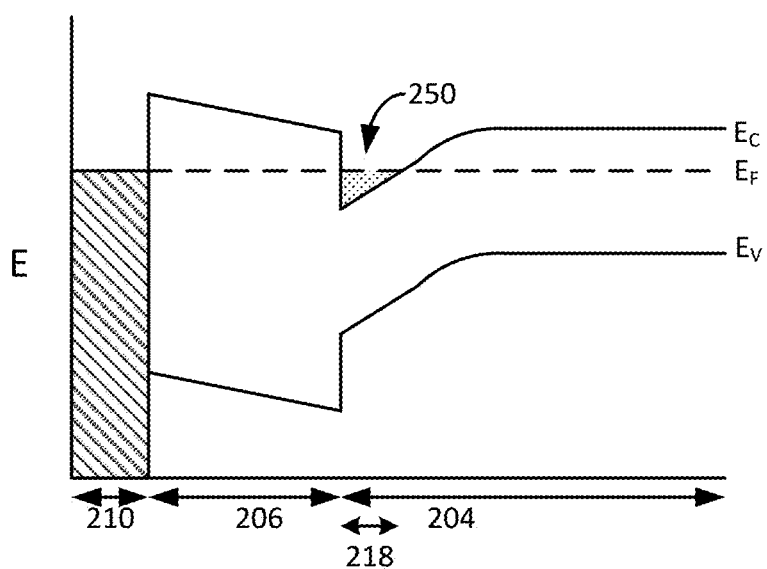
FIG. 2 is a band diagram for the device of FIG. 1.

FIG. 2 shows a band diagram for the device of FIG. 1 for the structure from F to F'. Gate 110, formed of a metal, is shown in region 210 of the diagram. The wider band gap of $Al_xGa_{1-x}N$ forming barrier 106 (shown in region 206 of the diagram) relative to the band gap of GaN forming buffer 104 (shown in region 204) traps electrons in the 2DEG, shown at 250, in channel region 118 (shown at 218.) Those skilled in the art will appreciate that the composition of barrier 106 and buffer 104 can be varied and/or graded, using, for example, any suitable combination of AlN, $Al_xGa_{1-x}N$, GaN, $In_xGa_{1-x}N$, and $In_xAl_yGa_{1-x-y}N$, so long as the barrier to electron flow at the heterojunction between barrier 106 and buffer 104 (regions 206 and 204) is maintained. For example, the channel region may be formed of $In_xGa_{1-x}N$. Introducing indium would decrease the band gap of the channel region, increasing the height of the barrier to electron flow at the heterojuction.

When voltage differential is applied between drain 114 and source 112, the channel 118 conducts current with no voltage differential between source 112 and gate 110. The device is described as a "normally on" device, in that the transistor is on, with current in the channel, even with zero or negative voltage bias applied between gate and source. There will be current flow in the channel in the event of a failure leading to a floating or grounded gate terminal. For safety and for circuit simplicity, for most uses a normally off device is preferred over a normally on device. Note that FIG. 1, and subsequent figures, are not to scale.

Figure 3A:
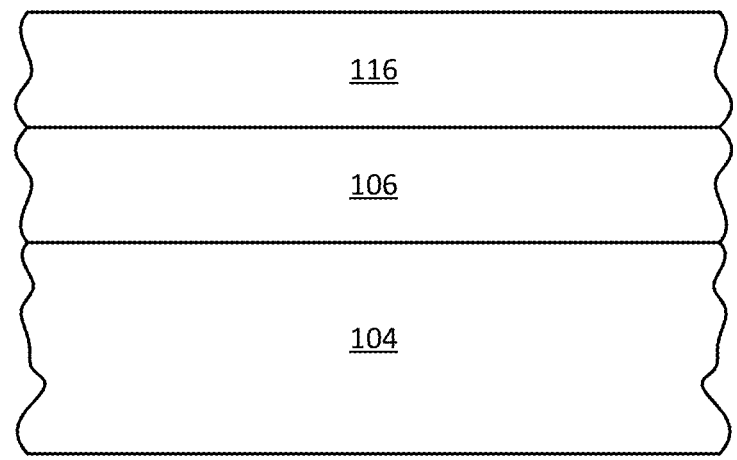
FIGS. 3a and 3b illustrate stages in formation of an HFET, showing intrinsic compressive stress in the dielectric layer.

Turning to FIG. 3a, during fabrication of an HFET, following growth of barrier 106, passivation layer 116 is deposited. As noted, passivation layer 116 is typically of silicon nitride, though other suitable dielectrics, such as aluminum oxide, may be used instead. In this discussion, a layer that is described as substantially silicon nitride is a compound of silicon and nitrogen that is predominantly $Si_3N_4$, though the layer is usually not perfectly stoichiometric. Passivation layer 116 is believed to reduce or eliminate surface charges that may form at the surface of barrier 106.

Figure 3B:
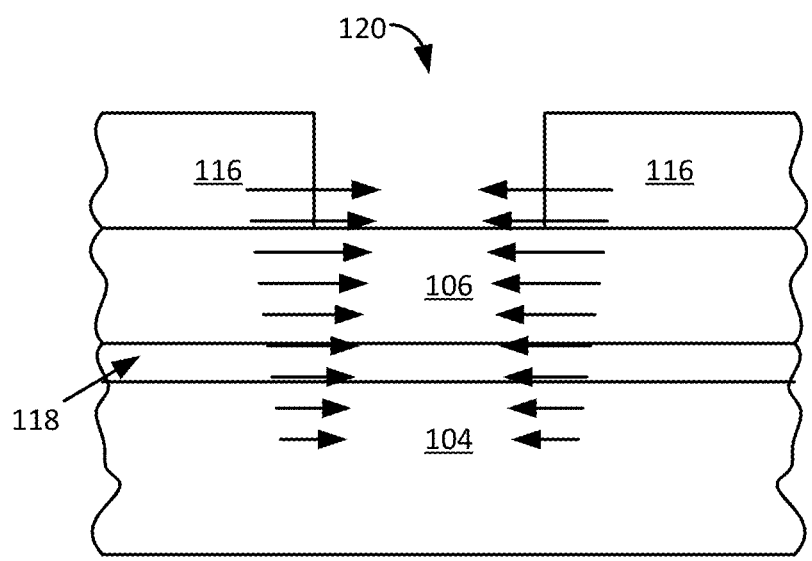

Turning to FIG. 3b, passivation layer 116 is typically amorphous, and, as conventionally deposited, has significant intrinsic compressive stress. Thus when opening 120 is patterned in passivation layer 116, as for a gate opening, the remaining segments of passivation layer 116 will attempt to expand (shown by arrows), exerting compressive stress on barrier 106 and buffer 104, including to channel region 118 of buffer 104 and underneath. As shown by the length of the arrows, the exerted stress decreases with depth, i.e. with distance from passivation layer 116. Arrow length is not to scale. Due to the piezoelectric properties of the crystalline III-V semiconductors typically used for buffer 104, such as GaN, the exerted stress/strain gradient creates a negative piezoelectric charge in barrier 106, channel region 118 and buffer 104. The piezoelectric charge has greatest magnitude where strain gradient is at a maximum, beneath the patterned boundaries of passivation layer 116. The strain (which will determine the strain gradient) developed in buffer 104 depends on the width of opening 120 (typically >0.5 μm for a power device) and the strain is generally too small to create significant negative piezoelectric charge. But wide opening 120 (i.e. which corresponds to large gate length) is important for a power device to prevent punch-through current at large drain 114 bias. In the completed device of FIG. 1, the negative piezoelectric charge in channel region 118 and underneath in buffer 104 is not sufficient to shift threshold voltage.

Figure 4:
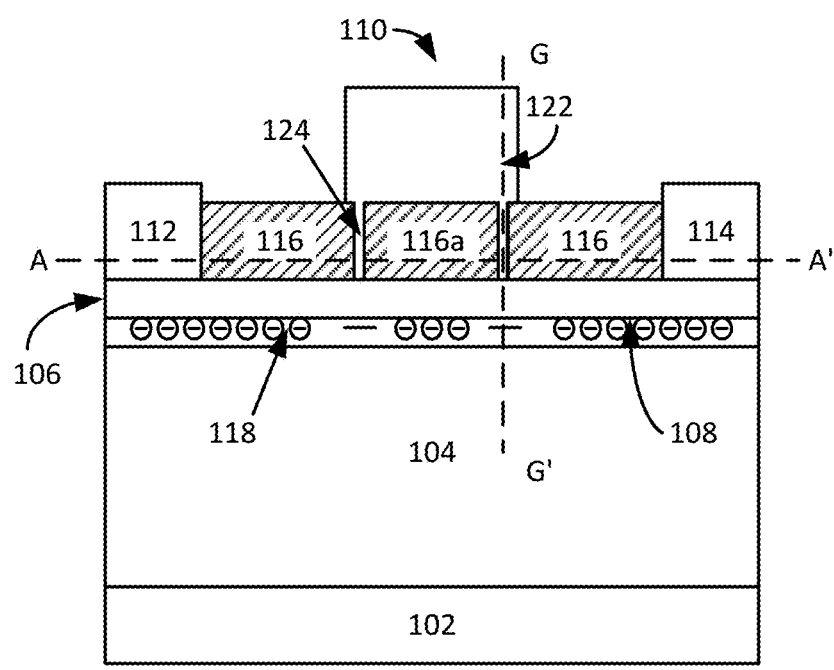
FIG. 4 illustrates an HFET having a tined gate as described herein.

Turning to FIG. 4, in embodiments described herein, gate 110 of an HFET is modified to include a main body 122 and a plurality of tines 124. Tines 124 have proximal ends connected to the main body 122, middle portions projecting through a plurality of gaps, and distal ends separated from a first piezoelectric layer, buffer 104, by at least a second piezoelectric layer, barrier 106. Passivation layer 116 has a plurality of segments separated by a plurality of gaps, and segments of passivation layer 116 (for example, segment 116a) remain between tines 124. Main body 122 covers at least one dielectric segment 116a of the plurality of dielectric segments and covers at least two gaps of the plurality of gaps. For a narrow tine 124, the two patterned edges of passivation layer 116 are sufficiently close to each other that the stress they exert is cumulative, increasing the strain and strain gradient and thus the negative polarization charge (indicated by the "-" symbol) to deplete the 2DEG underneath. Also, with multiple tines, due to electrostatics, punch-through current is suppressed as in conventional wide opening 120. By generating a piezoelectric charge and shifting threshold voltage, the device of FIG. 4 has become a normally off device, with a positive threshold voltage. Threshold voltage is the minimum gate-to-source voltage differential required to create a conducting path between the source and drain. In a normally off device, channel 118 is non-conducting when there is a voltage difference between source 112 and drain 114 and there is no voltage applied between gate 110 and source 112 or between gate 110 and drain 114.

More generally, use of a tined gate allows a shift in threshold voltage. In different configurations, the threshold voltage shifts in different ways, as will be shown in later examples. Those skilled in the art will appreciate that current passes between source 112 and channel region 118 and between channel region 118 and drain 114 by tunneling through the barrier 106, not depicted in FIG. 4. Unlike the ohmic contact of source 112 and drain 114 on barrier 106, the Schottky barrier between gate 110 and barrier 106 discourages tunneling between gate 110 and barrier 106. In some embodiments, not shown, barrier 106 is etched beneath source 112 and drain 114 so that they contact channel 118 directly and allow current to pass without requiring tunneling through the barrier 106.

As noted earlier, each of buffer 104 and barrier 106 is a piezoelectric layer and may be substantially a crystalline III-V semiconductor. A layer which is substantially a crystalline III-V semiconductor is predominantly formed of a III-V semiconductor material in a manner intended to produce a crystalline form, but, as those skilled in the art will understand, the resulting layer may include some impurities, and may include some crystal defects.

This discussion has described dielectric layer 116 as a passivation layer. In other embodiments, layer 116, or some thickness of layer 116, may be included for passivation, as a gate dielectric, solely for the purpose of enabling the tined gate, for some other reason, or for a combination of reasons. Layer 116 can be of any suitable material, for example a dielectric layer, which exerts tensile or compressive stress on underlying layers when an opening is patterned in it. Though the purpose of layer 116 may not be entirely for passivation, for consistency this discussion will continue to refer to it as passivation layer 116. In other cases, layer 116 is a dielectric layer unrelated to passivation.

In an HFET, barrier 106 is between passivation layer 116 and channel region 118. Barrier 106 and buffer 104 (specifically channel region 118) contact at heterojunction 108.

The dimensions of tines 124 may be selected according to the materials used and the properties and dimensions of other elements of the device. For example, in a device having barrier 106 of undoped $Al_xGa_{1-x}N$ where x is between about 0.1 and 1, and having a thickness of about 10-30 nm; and passivation layer 116 of $Si_3N_4$ and thickness of about 100-2000 nm, tines 124 may have a width, measured in the direction of current in the channel, of, for example, about 200 nm or less, for example about 100, 70, 50 or 30 nm or less. As has been described, the piezoelectric effect created by stress exerted beneath two adjacent patterned edges of passivation layer 116 is increased when the edges are close enough that the stress, and the resultant piezoelectric charge, are cumulative. In most embodiments a tine width of 200 nm or less will produce this effect. There may be two, three, or more tines. The distance between the outer edges of the outermost tines may be about a conventional gate length. This may vary widely depending on the application, from, for example, about 70 nm to 1.5 micron and beyond, most typically between about 0.5 micron and 1.5 microns. In the example shown in FIG. 4, the gate length is slightly longer than the distance between the outer edges of the outermost tines 124, and is about 0.8 microns. The width of each tine 124 measured parallel to the direction of current in the channel is about 50 nm. The length of passivation layer segment 116a is about 0.6 microns. Note the gate length may be greater than the distance between the outer edges of the outermost tines to provide a margin for misalignment during patterning of gate 110.

Example dimensions have been provided for completeness, but those skilled in the art will appreciate that the optimal dimensions of tines 124 will vary depending on many factors, including the thickness, composition, and deposition conditions of passivation layer 116, the thickness and composition of barrier 106, the composition of buffer 104, the type and concentration of defects in barrier 106 and buffer 104, the composition of gate 110, the desired threshold voltage shift, etc. In general, with wider tines, the positive shift in threshold voltage is less, while the risk of punch-through current decreases.

In some embodiments, passivation layer 116 exerts compressive stress of at least −100 MPa, for example up to about −2 GPa or more. The exerted stress induces a piezoelectric charge in buffer 104 (including in channel 118, at the top of buffer 104, adjacent to barrier 106) beneath the tine of between about $1 \times 10^{11}$ and $5 \times 10^{13}$ per cm² of electronic charge, for example, between about $1 \times 10^{11}$ and $1 \times 10^{13}$ per cm² of electronic charge. In embodiments described herein, at least about $1 \times 10^{11}$ per cm² of electronic charge is sufficient to disrupt the 2DEG in channel region 118.

Figure 5A:
FIGS. 5a, 5b, 5c and 5d illustrate various tine patterns and arrangements.
Figure 5B:
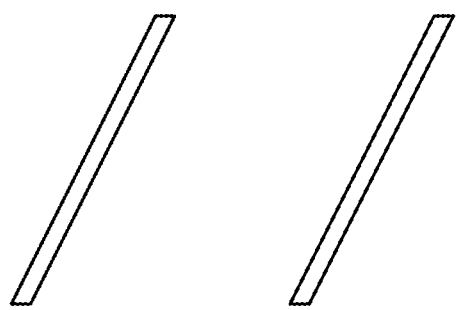
Figure 5C:
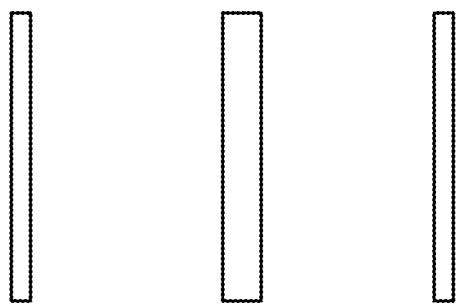
Figure 5D:
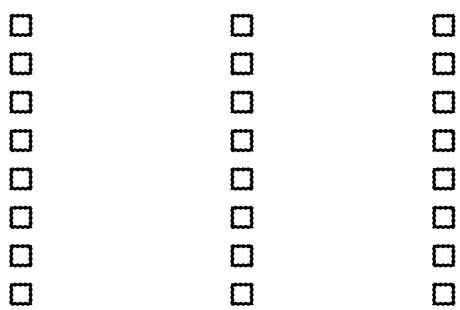

Tines may or may not all be the same width, and may be distributed at any interval to optimize the tradeoff between threshold voltage, punch-through current and other device parameters. FIG. 5a shows a cross-section of tines 124 taken at A-A' in FIG. 4. FIGS. 5b-5d show other possible configurations of tines 124. Tines may be solid (as in 5a-5c) or segmented (as in 5d) or mixed, and may or (as in 5c) may not have uniform width or spacing. More configurations may be envisioned.

Figure 6:
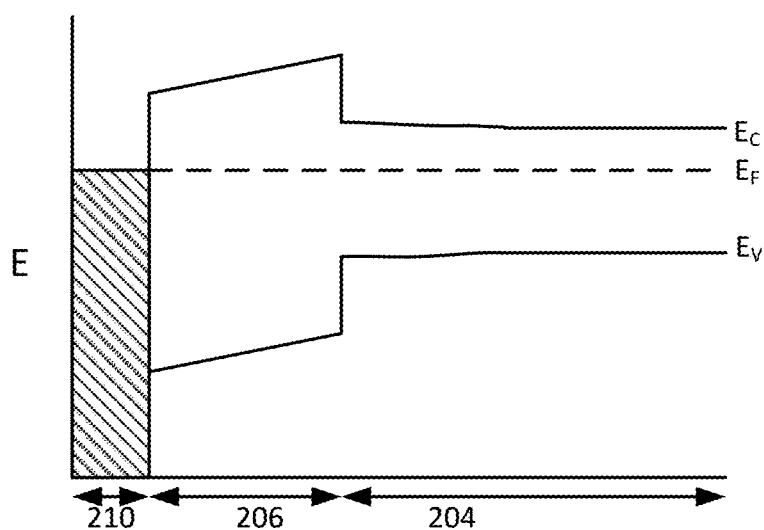
FIG. 6 is a band diagram for the device of FIG. 4.

FIG. 6 shows a band diagram for the device of FIG. 4 for the structure from G to G'. As in the band diagram of FIG. 2, region 210 corresponds to gate 110, region 206 corresponds to barrier 106, and region 204 corresponds to buffer 104. The piezoelectric charge induced by tine 124 shifts $E_C$ and $E_V$ upward in barrier 106 and buffer 104 (in regions 206 and 204 of FIG. 6), thereby eliminating the 2DEG in the absence of applied bias.

In the example provided in FIG. 4, use of a tined gate according to embodiments described herein changed a normally on device to a normally off device. More generally, the threshold voltage of an existing field effect transistor can be shifted, in either a positive or negative direction, and by varying amounts, by replacing a conventional gate with a tined gate as described herein.

In FIG. 4, the materials were selected such that changing a conventional gate to a tined gate induced a negative piezoelectric charge in barrier 106 and buffer 104, specifically in channel region 118 of buffer 104. By selecting different materials, or forming those materials in different ways, a positive piezoelectric charge can be induced instead. In the example, the shift of threshold voltage was arranged to move threshold voltage from negative to positive. By arranging the device differently, use of a tined gate can make a positive threshold voltage more positive, or a negative threshold voltage more negative, or can make a positive threshold voltage negative.

Device Performance

Figure 7:
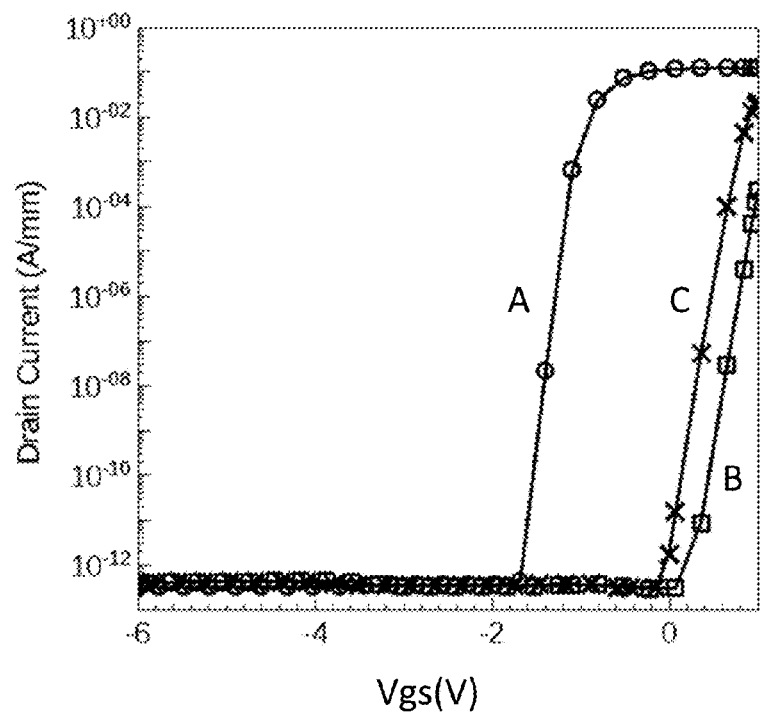
FIG. 7 is a graph showing threshold voltages for simulated devices having a gate with no tines, two tines, or three tines.

FIG. 7 shows simulated $I_{DS}$-$V_{GS}$ curves for three devices. (This graph and the graphs of FIGS. 8-10 were produced using commercial EDA simulation software.) The graph plots drain current vs applied gate voltage. Curve A is for an HFET with a conventional gate. Its threshold voltage is negative. Curve B is for an HFET with a gate having two tines. Its threshold voltage is positive. Curve C is for an HFET with a gate having three tines, and its threshold voltage is slightly negative, but has been shifted in a positive direction by about 1.5 v. It will be seen that in this case the threshold voltage shift is greater for a gate with two tines than with three. This is because passivation layer regions 116a between tines 124 (in FIG. 4) are smaller when there are more tines, so the strain energy is less. Less strain energy exerts less stress to the channel. Less stress to the channel results in a smaller piezoelectric charge, and a smaller shift in threshold voltage. For all three devices, the total gate length was about 0.7 microns. For the devices with tined gates, the tines were evenly spaced with about 50 nm width. In general, tine width in the direction of the channel is less than about 200 nm, though any width may be used.

Figure 8:
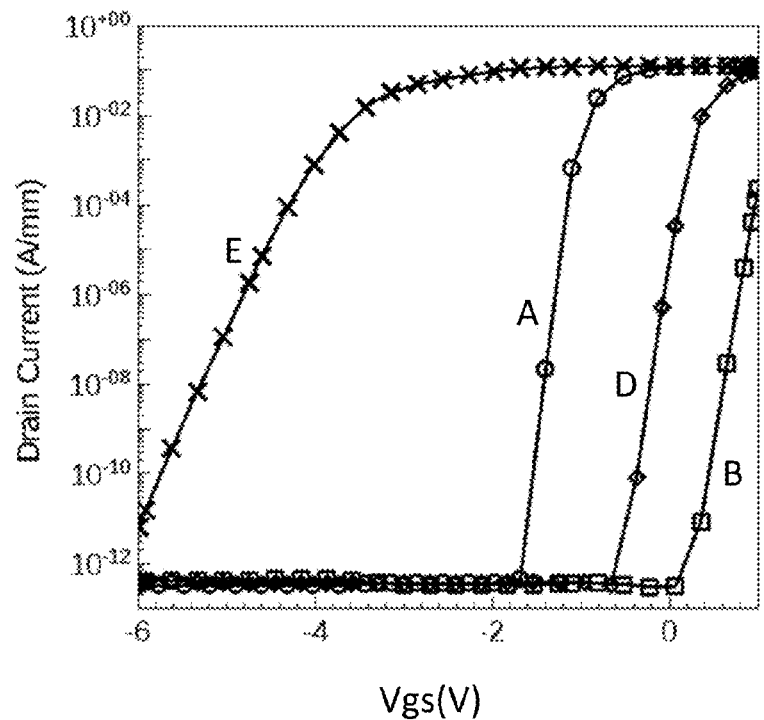
FIG. 8 is a graph showing threshold voltages for simulated devices of tined and non-tined gates of various configurations and materials.

FIG. 8 shows device behavior when the device is changed in other ways. For reference, curve A and curve B in FIG. 8 are the same as those in the graph of FIG. 7; a conventional gate and a two-tined gate, respectively, with a tine width of about 50 nm. The device of curve D is a two-tined gate with wider tines, having a width of 300 nm, and it will be seen that the voltage shift is less for a device with wider tines. The device of curve E is a two-tined gate with a tine width of about 50 nm, the same as the device of curve B, but in this device passivation layer 116 is formed using a different method, or of different material, such that passivation layer 116, when patterned, exerts tensile rather than compressive stress on underlying layers. It will be seen that in the device of curve E, the threshold voltage is shifted in a negative direction.

Figure 9:
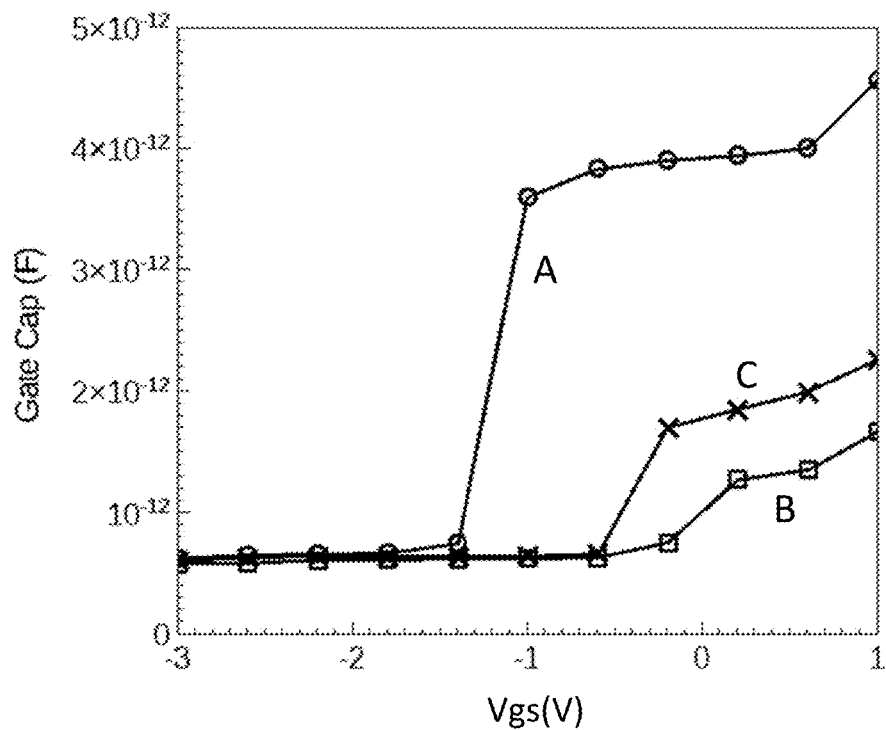
FIG. 9 is a graph showing gate capacitance in simulated devices having a gate with no tines, two tines, or three tines.

The tined gate of embodiments described herein offers the additional advantage of reducing gate capacitance, and thus higher operation frequency and less switching energy loss. FIG. 9 shows CV curves simulated for three devices with 1 mm width. The graph plots gate capacitance vs applied gate voltage. For an HFET with a conventional, non-tined gate (curve A), gate capacitance is between $3.0\times10^{-12}$ and $4.0\times10^{-12}$ F, while two-tined (curve B) and three-tined (curve C) devices have gate capacitance of about $2.0\times10^{-12}$ F or less. Gate capacitance is least for a two-tined gate. Barrier 106 acts as an insulator between gate 122 and the 2DEG, forming a capacitor. With fewer tines, there is less area for this capacitor, hence lower capacitance. Of course, gate 122 and the 2DEG still form a capacitor through passivation region 116a and barrier 106, but 116a is a thick dielectric, so capacitance is less. A gate having exactly two tines may be preferred.

Figure 10:
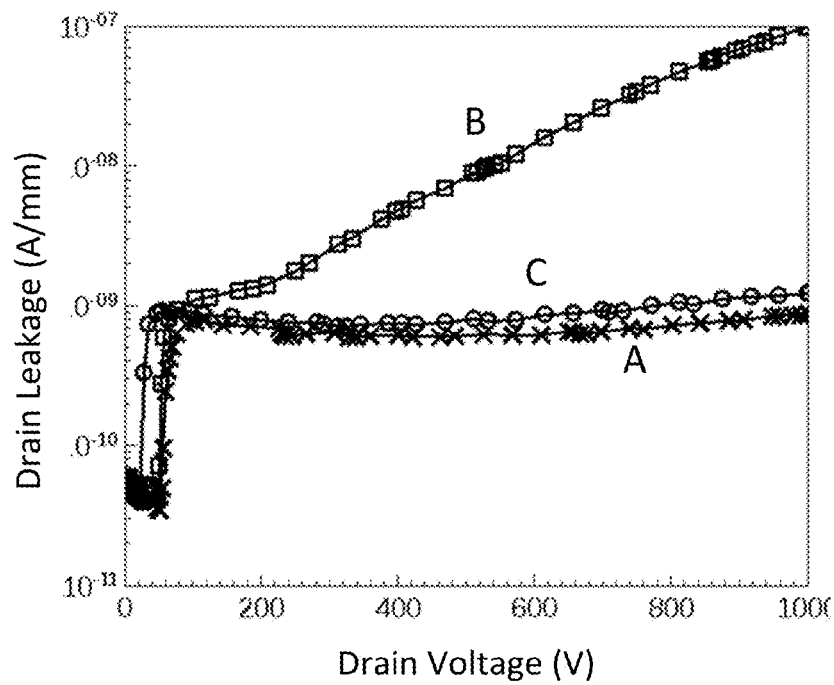
FIG. 10 is a graph showing drain leakage in simulated devices having a gate with no tines, two tines, or three tines.

FIG. 10 shows simulated off-state leakage current, plotting drain leakage vs drain voltage. As will be seen, leakage is nearly identical for an HFET having a conventional gate (curve A) and an HFET having three tines (curve C). Leakage increases for a gate having two tines (curve B.) The effective gate area is less with two tines than with three or more and the gate has less control over the electrostatic potential in the buffer. With three tines, it has more control. Also, with more tines, the distance between tines is shorter, and there is more synergy effect between them. Thus a device with a three- (or more) tined gate has better control and less punch-through current than one with a two-tined gate. Leakage on a two-tined gate remains well within acceptable limits, however.

Fabrication

Fabrication of a tined-gate device may be achieved with minimal modifications to an existing process for producing a device with a conventional gate. The process may be unchanged through deposition of the passivation layer on the barrier. For example, FIG. 11a shows the structure during fabrication of an HFET immediately following patterning of passivation layer 116 for a conventional gate, while FIG. 11b shows the structure at the same stage for a gate with two tines. Fabrication continues with deposition of the gate layer 110 in FIG. 12a (for a conventional gate) and FIG. 12b (for a tined gate), followed by patterning to define conventional gate 110 in FIG. 13a and tined gate 110 in FIG. 13b. As shown, the length of gate 110 may be slightly longer than the distance between the outer edges of the tines to provide a margin for misalignment.

It will be apparent that an existing device using a tined gate can readily be modified to change threshold voltage by changing aspects of the tines. For example, a two-tined gate can be replaced with a three-tined gate or vice versa. Placement or dimensions of the tines can be changed. The resulting device will have different properties, as illustrated by FIGS. 7 through 10 and associated discussion.

In other existing processes, the gate may be formed before the passivation layer. In this case, the flow may need to be modified to deposit and pattern the passivation layer before gate formation.

For embodiments in which passivation layer 116 is silicon nitride, this discussion has assumed a conventional deposition method, producing a film with intrinsic compressive stress. For example, such a film may be deposited using plasma-enhanced chemical vapor deposition. Temperature may be between about 400-600 deg. C., using, for example, $SiH_4$ and either $NH_3$ or $N_2$ as precursors. A study of silicon nitride deposition conditions and resulting stress, "Interpretation of stress variation in silicon nitride films deposited by electron cyclotron resonance plasma," Besland et al., Journal of Vacuum Science and Technology A, American Vacuum Society, 2004, 22(5), pp. 1962-1970, is hereby incorporated by reference. Deposition conditions can be altered to customize the amount of stress, and whether the stress is compressive or tensile. In other embodiments, any other suitable material that has high intrinsic compressive stress, or tensile stress, can be used instead of silicon nitride. Simulations of embodiments described herein have assumed intrinsic stress from 2 GPa to −2 GPa. To produce a useful piezoelectric charge in channel region 118, in embodiments compressive or tensile stress exerted by the passivation layer will have an absolute value greater than about 100 megapascals, for example greater than about 200 or about 500 megapascals.

For clarity, an HFET formed of a GaN buffer and an $Al_xGa_{1-x}N$ barrier has been described, but it will be appreciated that a tined gate according to embodiments as described herein may be employed to modify threshold voltage in different devices, or in devices formed of other materials. Any combination of members of the In—Al—Ga—N system may be employed. In other words, any group III-nitride semiconductor may be used. A group III-nitride semiconductor is substantially a nitride of indium, gallium, or aluminum, or of any combination of any two or all three of indium, gallium, and aluminum. Alternatively, group II-VI semiconductors may be used instead, or any other suitable material having piezoelectric properties, for example a crystalline piezoelectric material.

Variations

Many other variations are possible. The buffer of an HFET can be formed of $Al_xGa_{1-x}N$ with the value of x varying from bottom to top. Some HFETs include a gate insulator. A device may be formed of the GaAs, $Al_xGa_{1-x}As$, $In_xGa_{1-x}As$, etc., family instead, or using any suitable combination of III-V or II-VI semiconductors. An HFET can be implemented as a finFET, in which a gate wraps around a fin-shaped channel. Aluminum oxide may be used for the passivation layer rather than silicon nitride. In any of these cases, an existing process may readily be modified to create a tined gate rather than a conventional gate, according to embodiments of the present invention, to modify threshold voltage of the device. The HFET device described and closely related devices may also be known by other names, such as high-electron-mobility transistor (HEMT) and metal insulator semiconductor heterostructure field effect transistor (MISHFET).

It has been shown how use of a tined gate according to embodiments described herein can change the threshold voltage of a device, changing it from normally on to normally off. A tined gate can also be used to change threshold voltage in other ways. For example, other schemes have been employed to make normally off HFETs, including p-gates and recessed gates. An advantage of the tined gate is that it is additive, and can easily be used in conjunction with these or any other methods, enhancing their results, for example making threshold voltage even more positive.

As noted earlier, a tined gate as described herein may have the opposite effect, to make threshold voltage more negative. This can be achieved using the tined gate of the present invention, and selecting materials to have this effect. For example, one may select a passivation layer having intrinsic tensile stress, rather than compressive stress, by choosing a material other than silicon nitride—aluminum oxide, for example—or by altering deposition conditions. For example, in some embodiments, intrinsic tensile stress of the passivation layer may be between about 100 megapascals up to about 2 GPa or more. Alternatively, the channel (specifically the buffer supporting the channel) may be formed of a material that has a positive rather than a negative piezoelectric charge under compressive stress; one suitable material is N-face GaN. In some embodiments, a field effect transistor having a tined gate as described herein may have a negative threshold voltage.

In short, the tined gate described herein can be used to change threshold voltage in any suitable device, for example any field effect transistor, having a buffer, channel region, or barrier made of any material having piezoelectric properties.

The method described herein can be used with any suitable device, such as heterojunction field effect transistors including: high electron mobility transistors (HEMTs), or metal-insulator-semiconductor-HFETs (MISHFETs), or double-channel HFETs/HEMTs/MISHFETs, or dual-Channel HFETs/HEMTs/MISHFETs, or thin-body (SOI, finFET, tri-gate, gate-all-around, etc.) HFETs/HEMTs/MISHFETs). The methods may be applicable to suitable non-heterojunction devices, such as metal-semiconductor field effect transistors (MESFETs).

Figure 14A:
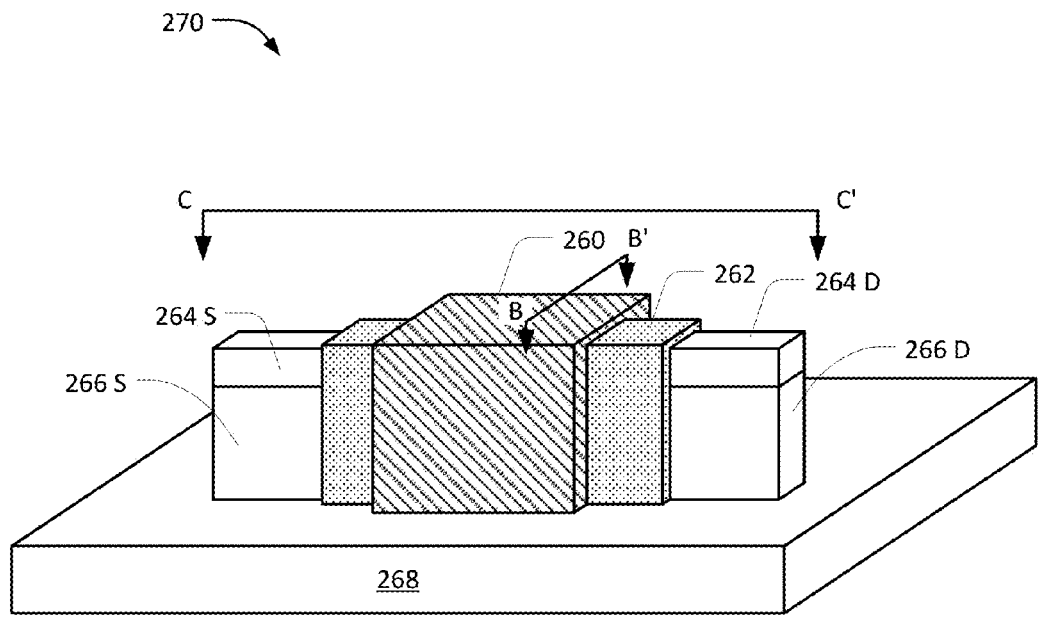
FIGS. 14a and 14b are perspective and cross-sectional views of a finFET device having a gate with no tines.
Figure 14B:
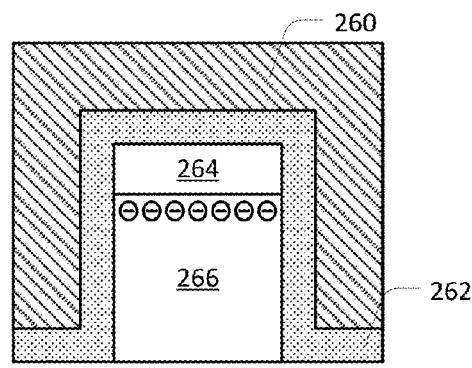

As an example, FIG. 14a shows a finFET device, described in more detail in "High-Performance GaN-Based Nanochannel FinFETs With/Without AlGaN/GaN Heterostructure," Im et al., IEEE Transaction on Electron Devices, Vol. 60, No. 10, October, 2013, pp. 3012-3018. FinFET 270 is formed on highly resistive GaN/sapphire substrate 268. Ni/Au gate 260 wraps around an epitaxially grown heterostructure comprising GaN 266 and AlGaN 264; the source and drain of the device are indicated as 264/266S and 264/266D, respectively. The device also includes gate oxide 262. As shown in FIG. 14b, a cross-sectional view taken at B-B', the heterojunction between AlGaN barrier 264 and GaN buffer 266 creates a 2DEG in a channel region at the top of buffer 266.

This device can be modified in various ways to include a tined gate. One way will be described.

Figure 15A:
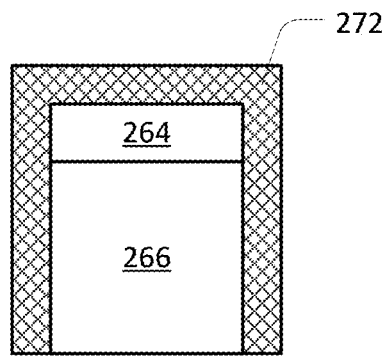
FIGS. 15a, 15b and 15c show cross-sectional views of the same device modified to have a tined gate.
Figure 15B:
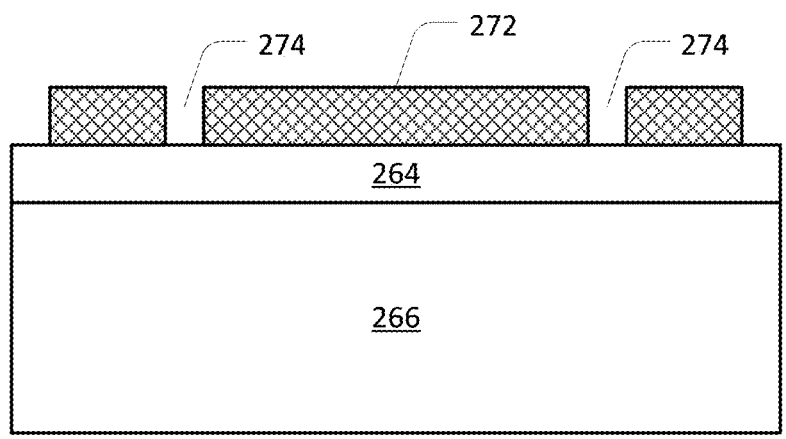
Figure 15C:
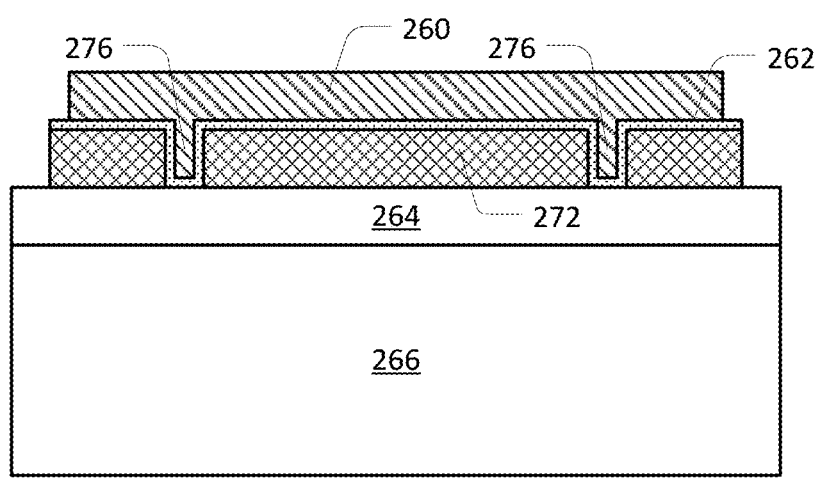

Referring to FIGS. 15a and 15b, following epitaxial growth and patterning of GaN layer 266 and AlGaN layer 264, a dielectric layer 272, for example of silicon nitride, may be deposited over the 264/266 heterostructure (cross-sections taken along B-B' and C-C' of FIG. 14a, respectively.) Tine openings 274 are patterned in dielectric layer 272, having any desired width, for example between 50 nm and 100 nm. Dielectic layer 272 now has a plurality of dielectric segments separated by a plurality of gaps. Next, referring to FIG. 15c (also a cross-section along C-C'), gate oxide 262 and Ni/Au gate layer 260 are deposited. Gate oxide 262 and gate 260 wrap around heterostructure 264/266 as in the original device. Gate oxide 262 is conformally deposited, and its thickness is selected so as not to completely fill the tine openings, leaving a gap for formation of tines 276 when gate layer 260 is deposited; for example, its thickness may be between about 5 and 20 nm. Tines 276 have proximal ends connected to the main body of gate 260, middle portions projecting through the plurality of gaps 274, and distal ends separated from a first piezoelectric layer, buffer 266, by at least second piezoelectric layer, barrier 264. The main body of gate 260 covers at least one dielectric segment of the plurality of dielectric segments and covers at least two gaps of the plurality of gaps. The modifications required to fabrication of the original device to accommodate the tined gate described herein may be no more than depositing and patterning dielectric layer 272. The thickness of gate oxide layer 262 may be adjusted as well.

In alternative embodiments (referring to FIG. 4), tines 124 can be biased separately by segmenting body 122 into parts connecting to individual tine or groups of tines. The transistor then becomes a multiple gate device. This offers improved flexibility for a circuit designer to optimize speed and energy or other special transistor operations.

The embodiments described herein provide the advantage that for a device already in production, or for which a process flow has already been determined, the threshold voltage of a transistor can be changed by, in some cases, changing only the masks used to pattern the passivation layer and possibly the gate, while leaving the rest of the process flow unchanged. Without changing any other elements of the layout, or the process flow, the resulting device may have a second threshold voltage, different from the first threshold voltage by 0.1 volt, 0.2 volt, 0.5, volt, 1 volt or more. This is a relatively simple and inexpensive alteration. In other embodiments other small changes may be required. Layer thicknesses may be modified, for example.

Summarizing, embodiments described herein include a method to modify a mask set used to fabricate a field effect transistor. The method includes replacing a first mask or masks of the mask set with a second mask or masks. A heterojunction field effect transistor made using the first mask or masks may be like the device of FIG. 1, in which passivation layer 116 is divided by a gate opening, and gate 110 is disposed in the gate opening. A heterojunction field effect transistor made using the second mask or masks may be like the device of FIG. 4, in which passivation layer 116 has a plurality of dielectric segments separated by a plurality of gaps. Gate 110 includes a main body 122 and a plurality of tines 124. Tines 124 have proximal ends connected to main body 122, middle portions projecting through the plurality of gaps, and distal ends separated from buffer 104 by at least barrier 106. Main body 122 covers at least one dielectric segment 116a of the plurality of dielectric segments and covers at least two gaps of the plurality of gaps. Each tine 124 has a width, parallel to the direction of current flow in the channel, of less than 200 nm.

Other aspects of the mask set will generally remain unchanged. For example, the isolation mask, source/drain contact mask, field plate mask, and other interconnect masks are not affected.

Suppose that the first field effect transistor has a first threshold voltage and the second field effect transistor has a second threshold voltage. As a result of replacing the first mask or mask with the second mask or masks, the second threshold voltage is different from the first, for example is greater or less by at least 0.1 volt, 0.2 volt, 0.5, volt, 1 volt or more. This may be achieved without changing any other elements of the layout, or the process flow other than patterning of the passivation layer and possibly of the gate. This is a relatively simple and inexpensive alteration. In other embodiments other small changes may be required. Layer thicknesses may be modified, for example.

The ease of modification afforded by the methods described herein allows for improved design flexibility. In a circuit having two or more conventional heterojunction field effect transistors with the same threshold voltage, for example, each of those transistors can be changed to have a different threshold voltage by changing a single mask. For example, if there are three heterojunction field effect transistors in the circuit, a first can be modified to have a gate with two narrow tines, a second to have a gate with three narrow tines, and a third to have a gate with two wider tines, all by changing only a single mask. Each resulting transistor will have a different threshold voltage.

Figure 16:
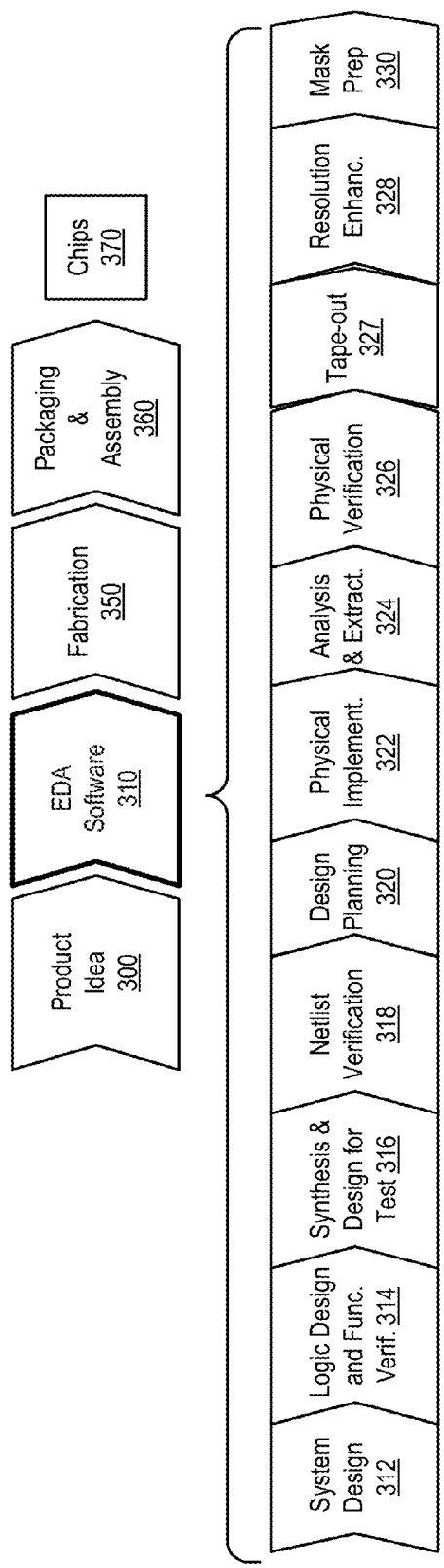
FIG. 16 shows a simplified representation of an illustrative digital integrated circuit design flow.

FIG. 16 shows a simplified representation of an illustrative digital integrated circuit design flow. At a high level, the process starts with the product idea (module 300) and is realized in an EDA (Electronic Design Automation) software design process (module 310). When the design is finalized, it can be taped out (module 327). At some point after tape out, the fabrication process (module 350) and packaging and assembly processes (module 360) occur resulting, ultimately, in finished integrated circuit chips (result 370).

The EDA software design process (module 310) is itself composed of a number of modules 312-330, shown in linear fashion for simplicity. In an actual integrated circuit design process, the particular design might have to go back through modules until certain tests are passed. Similarly, in any actual design process, these modules may occur in different orders and combinations. This description is therefore provided by way of context and general explanation rather than as a specific, or recommended, design flow for a particular integrated circuit.

A brief description of the component modules of the EDA software design process (module 310) will now be provided.

System design (module 312): The designers describe the functionality that they want to implement, they can perform what-if planning to refine functionality, check costs, etc. Hardware-software architecture partitioning can occur at this stage. Example EDA software products from Synopsys, Inc. that can be used at this module include Model Architect, Saber, System Studio, and DesignWare® products.

Logic design and functional verification (module 314): At this stage, the VHDL or Verilog code for modules in the system is written and the design is checked for functional accuracy. More specifically, the design is checked to ensure that it produces correct outputs in response to particular input stimuli. Example EDA software products from Synopsys, Inc. that can be used at this module include VCS, VERA, DesignWare®, Magellan, Formality, ESP and LEDA products.

Synthesis and design for test (module 316): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this module include Design Compiler®, Physical Compiler, DFT Compiler, Power Compiler, FPGA Compiler, TetraMAX, and DesignWare® products.

Netlist verification (module 318): At this module, the netlist is checked for compliance with timing constraints and for correspondence with the VHDL/Verilog source code. Example EDA software products from Synopsys, Inc. that can be used at this module include Formality, PrimeTime, and VCS products.

Design planning (module 320): Here, an overall floor plan for the chip is constructed and analyzed for timing and top-level routing. Example EDA software products from Synopsys, Inc. that can be used at this module include Astro and Custom Designer products.

Physical implementation (module 322): The placement (positioning of circuit elements) and routing (connection of the same) occurs at this module, as can selection of library cells to perform specified logic functions. Example EDA software products from Synopsys, Inc. that can be used at this module include the Astro, IC Compiler, and Custom Designer products.

Analysis and extraction (module 324): At this module, the circuit function is verified at a transistor level, this in turn permits what-if refinement. In embodiments, the transistor will be a tined-gate heterojunction field effect transistor as described herein. Example EDA software products from Synopsys, Inc. that can be used at this module include AstroRail, PrimeRail, PrimeTime, and Star-RCXT products.

Physical verification (module 326): At this module various checking functions are performed to ensure correctness for: manufacturing, electrical issues, lithographic issues, and circuitry. Example EDA software products from Synopsys, Inc. that can be used at this module include the Hercules product.

Tape-out (module 327): This module provides the "tape out" data to be used (after lithographic enhancements are applied if appropriate) for production of masks for lithographic use to produce finished chips. Example EDA software products from Synopsys, Inc. that can be used at this module include the IC Compiler and Custom Designer families of products.

Resolution enhancement (module 328): This module involves geometric manipulations of the layout to improve manufacturability of the design. Example EDA software products from Synopsys, Inc. that can be used at this module include Proteus, ProteusAF, and PSMGen products.

Mask data preparation (module 330): This module provides mask-making-ready "tape-out" data for production of masks for lithographic use to produce finished chips. Example EDA software products from Synopsys, Inc. that can be used at this module include the CATS® family of products.

The integrated circuit manufacturing flow includes a parallel flow, as follows:

(1) Develop individual process modules for manufacturing the integrated circuit. This can be modeled with EDA tools such as the Synopsys, Inc. tools "Sentaurus Process," "Sentaurus Topography," and "Sentaurus Lithography". The input information here includes the materials of the device being simulated, the process conditions like temperature, reactor ambient, implant energy, etc. The output information is the change in geometry or doping profiles or stress distribution.

(2) Integrate the individual process modules into the complete process flow. This can be modeled with EDA tools such as the Synopsys, Inc. tool "Sentaurus Process." The input information here is the collection of the process modules in the appropriate sequence. The output is the geometry, the doping profiles, and the stress distribution for the transistors and the space in between the transistors.

(3) Analyze performance of the transistor manufactured with this process flow. This can be done with EDA tools such as the Synopsys, Inc. tool "Sentaurus Device." The input information here is the output of module (3) and the biases applied to transistor terminals. The output information is the currents and capacitances for each bias combination.

(4) If necessary, modify the process modules and the process flow to achieve the desired transistor performance. This can be done iteratively by using tools such as the Synopsys, Inc. tools mentioned above.

Once the process flow is ready, it can be used for manufacturing multiple circuit designs coming from different fabless companies. The EDA flow 312-330 will be used by such fabless companies. The parallel flow described here can be used at a foundry to develop a process flow that can be used to manufacture designs coming from their fabless customers. A combination of the process flow and the mask preparation 330 are used to manufacture any particular circuit.

Those skilled in the art will appreciate that the EDA flow described above will require minimal modification, during layout for example, to produce a flow to fabricate an HFET device including a tined gate according to embodiments of present invention.

For example, a designed threshold voltage of a heterojunction field effect transistor may be modified: An original layout for an original heterojunction field effect transistor is provided in dependence upon a provided circuit design for the original transistor, the original transistor having a first piezoelectric layer supporting a channel, a second piezoelectric layer over the first piezoelectric layer, an original dielectric layer divided by a gate opening, the original dielectric layer over the second piezoelectric layer, and an original gate disposed in the gate opening. Then, using EDA software, the original layout may be modified to produce a modified layout by replacing the original dielectric layer with a modified dielectric layer having a plurality of dielectric segments separated by a plurality of gaps, and replacing the original gate with a modified gate, wherein the modified gate has a main body and a plurality of tines, the main body of the modified gate covering at least one dielectric segment of the plurality of dielectric segments and covering at least two gaps of the plurality of gaps, the plurality of tines having proximal ends connected to the main body of the modified gate, middle portions projecting through the plurality of gaps, and distal ends separated from the first piezoelectric layer by at least the second piezoelectric layer, each tine having a width, measured parallel to a direction of current flow in the channel, of less than 200 nm. The modified heterojunction field effect transistor produced using the modified layout may have a modified threshold voltage, different from the threshold voltage of the original transistor. The voltages may differ by at least 0.1 volts, 0.5 volts, 1 volt, or more.

Figure 17:
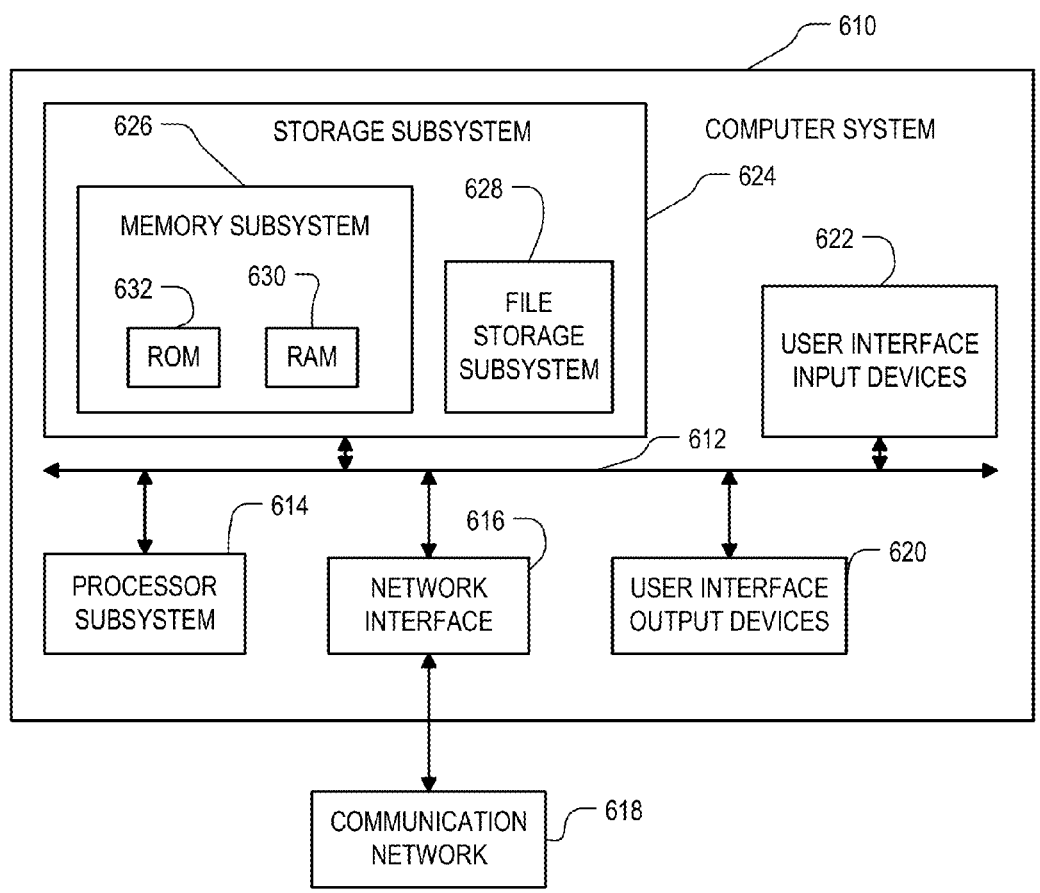
FIG. 17 is a simplified block diagram of a computer system that can be used to implement any of the methods and processes described herein.

FIG. 17 is a simplified block diagram of a computer system 610 that can be used to implement software to design and model a heterojunction field effect transistor, incorporating aspects of the tined gate described herein. While FIGS. 1 through 17 indicate individual components as carrying out specified operations, it will be appreciated that each component actually causes the computer system 610 to operate in the specified manner.

Computer system 610 typically includes a processor subsystem 614 which communicates with a number of peripheral devices via bus subsystem 612. These peripheral devices may include a storage subsystem 624, comprising a memory subsystem 626 and a file storage subsystem 628, user interface input devices 622, user interface output devices 620, and a network interface subsystem 616. The input and output devices allow user interaction with computer system 610. Network interface subsystem 616 provides an interface to outside networks, including an interface to communication network 618, and is coupled via communication network 618 to corresponding interface devices in other computer systems. Communication network 618 may comprise many interconnected computer systems and communication links. These communication links may be wireline links, optical links, wireless links, or any other mechanisms for communication of information, but typically it is an IP-based communication network. While in one embodiment, communication network 618 is the Internet, in other embodiments, communication network 618 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 622 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 610 or onto computer network 618.

User interface output devices 620 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 610 to the user or to another machine or computer system.

Storage subsystem 624 stores the basic programming and data constructs that provide the functionality of certain embodiments of the present invention. For example, the various modules implementing the functionality of certain embodiments of the invention may be stored in storage subsystem 624. These software modules are generally executed by processor subsystem 614. These software modules, and any other software relevant to the embodiments described herein, may be stored in a non-transitory manner on a computer readable medium.

Memory subsystem 626 typically includes a number of memories including a main random access memory (RAM) 630 for storage of instructions and data during program execution and a read only memory (ROM) 632 in which fixed instructions are stored. File storage subsystem 628 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 628. The host memory 626 contains, among other things, computer instructions which, when executed by the processor subsystem 614, cause the computer system to operate or perform functions as described herein. As used herein, processes and software that are said to run in or on "the host" or "the computer", execute on the processor subsystem 614 in response to computer instructions and data in the host memory subsystem 626 including any other local or remote storage for such instructions and data.

Bus subsystem 612 provides a mechanism for letting the various components and subsystems of computer system 610 communicate with each other as intended. Although bus subsystem 612 is shown schematically as a single bus, alternative embodiments of the bus subsystem may use multiple busses.

Computer system 610 itself can be of varying types including a personal computer, a portable computer, a workstation, a computer terminal, a network computer, a television, a mainframe, a server farm, or any other data processing system or user device. Due to the ever-changing nature of computers and networks, the description of computer system 610 depicted in FIG. 17 is intended only as a specific example for purposes of illustrating the preferred embodiments of the present invention. Many other configurations of computer system 610 are possible having more or less components than the computer system depicted in FIG. 17.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features.

In particular and without limitation, though many of the inventive aspects are described individually herein, it will be appreciated that many can be combined or used together with each other. All such combinations are intended to be included in the scope of this document.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated.

The invention claimed is:

1. A field effect transistor comprising:
a first piezoelectric layer supporting a channel;
a second piezoelectric layer over the first piezoelectric layer;
a dielectric layer having a plurality of dielectric segments separated by a plurality of gaps, the dielectric layer over the second piezoelectric layer; and
a gate having a main body and a plurality of tines, the main body of the gate covering at least one dielectric segment of the plurality of dielectric segments and covering at least two gaps of the plurality of gaps, the plurality of tines having proximal ends connected to the main body of the gate, middle portions projecting through the plurality of gaps, and distal ends separated from the first piezoelectric layer by at least the second piezoelectric layer,
wherein, in the first piezoelectric layer adjacent to the second piezoelectric layer, stress exerted by the dielectric layer creates a piezoelectric charge of at least about $1 \times 10^{11}$ per cm$^2$ of electronic charge.

2. The field effect transistor of claim 1 wherein the first piezoelectric layer is substantially a crystalline III-V semiconductor.

3. The field effect transistor of claim 2 wherein the second piezoelectric layer is substantially a crystalline III-V semiconductor.

4. The field effect transistor of claim 2 wherein the III-V semiconductor is a group III-nitride semiconductor.

5. The field effect transistor of claim 2, wherein the group III-V semiconductor is substantially a nitride of indium, gallium, or aluminum, or of any combination of any two or all three of indium, gallium, and aluminum.

6. The field effect transistor of claim 1 wherein there are exactly two tines.

7. The field effect transistor of claim 1 wherein the first piezoelectric layer and the second piezoelectric layer contact at a heterojunction.

8. The field effect transistor of claim 7 wherein the field effect transistor has a positive threshold voltage.

9. The field effect transistor of claim 7 wherein the field effect transistor has a negative threshold voltage.

10. The field effect transistor of claim 1 wherein the dielectric layer is substantially silicon nitride.

11. The field effect transistor of claim 1 wherein the dielectric layer exerts tensile or compressive stress having absolute value greater than about 100 megapascals.

12. The field effect transistor of claim 11 wherein the stress is compressive.

13. The field effect transistor of claim 11 wherein the stress is tensile.

14. The field effect transistor of claim 1 wherein each tine has a width, measured parallel to a direction of current flow in the channel, of less than about 200 nm.

15. The field effect transistor of claim 1 further comprising
a source electrically coupled to the second piezoelectric layer; and
a drain electrically coupled to the second piezoelectric layer,
wherein the channel is non-conducting when there is a voltage difference between the source and the drain and there is no voltage applied between the gate and the source or the gate and the drain.

16. A method to modify a mask set used to fabricate a heterojunction field effect transistor, the method comprising:
replacing a first mask or masks of the mask set with a second mask or masks,
wherein a first heterojunction field effect transistor made using the first mask or masks comprises:
a first transistor buffer layer supporting a first transistor channel,
a first transistor barrier layer over the first transistor buffer layer, wherein the first transistor barrier layer and the first transistor buffer layer both have piezoelectric properties,
a first transistor dielectric layer divided by a gate opening, the first transistor dielectric layer over the second transistor barrier layer, and
a first transistor gate disposed in the gate opening,
wherein a second heterojunction field effect transistor made using the second mask or masks comprises:
a second transistor buffer layer supporting a second transistor channel,
a second transistor barrier layer over the second transistor buffer layer, wherein the second transistor barrier layer and the second transistor buffer layer both have piezoelectric properties,
a second transistor dielectric layer having a plurality of dielectric segments separated by a plurality of gaps, the second transistor dielectric layer over the second transistor barrier layer, and
a second transistor gate having a main body and a plurality of tines, the main body of the second transistor gate covering at least one dielectric segment of the plurality of dielectric segments and covering at least two gaps of the plurality of gaps, the plurality of tines having proximal ends connected to the main body of the gate, middle portions projecting through the plurality of gaps, and distal ends separated from the second transistor buffer layer by at least the second transistor barrier layer, each tine having a width, measured parallel to a direction of current flow in the channel, of less than 200 nm, wherein the first transistor has a first threshold voltage and the second transistor has a second threshold voltage, and wherein the replacing step serves to cause the second threshold voltage to be different from the first threshold voltage.

17. The method of claim 16 wherein the first transistor buffer layer and the second transistor buffer layer are substantially III-V semiconductors.

18. The method of claim 16 wherein
the first transistor barrier and the first transistor buffer contact at a first transistor heterojunction, and
the second transistor barrier and the second transistor buffer contact at a second transistor heterojunction.

19. The method of claim 16 wherein the second threshold voltage is greater or less than the first threshold voltage by at least 0.1 volt.

20. The method of claim 19 wherein the second threshold voltage is greater or less than the first threshold voltage by at least 0.5 volt.

21. A method for modifying a designed threshold voltage of a heterojunction field effect transistor, comprising the steps of:
   a) providing an original layout for an original heterojunction field effect transistor in dependence upon a provided circuit design for the original transistor, the original transistor having a first piezoelectric layer supporting a channel, a second piezoelectric layer over the first piezoelectric layer, an original dielectric layer divided by a gate opening, the original dielectric layer over the second piezoelectric layer, and an original gate disposed in the gate opening; and
   b) using EDA software, modifying the original layout to produce a modified layout by:
      i) replacing the original dielectric layer with a modified dielectric layer having a plurality of dielectric segments separated by a plurality of gaps, and
      ii) replacing the original gate with a modified gate, wherein the modified gate has a main body and a plurality of tines, the main body of the modified gate covering at least one dielectric segment of the plurality of dielectric segments and covering at least two gaps of the plurality of gaps, the plurality of tines having proximal ends connected to the main body of the modified gate, middle portions projecting through the plurality of gaps, and distal ends separated from the first piezoelectric layer by at least the second piezoelectric layer, each tine having a width, measured parallel to a direction of current flow in the channel, of less than 200 nm,
   wherein a modified heterojunction field effect transistor produced using the modified layout has a modified threshold voltage and the original heterojunction field effect transistor produced using the original layout has an original threshold voltage, the modified threshold voltage different from the original threshold voltage.

22. The method of claim 21 wherein the first piezoelectric layer and the second piezoelectric layer contact at a heterojunction.

23. The method of claim 21 wherein the first piezoelectric layer and the second piezoelectric layer are substantially III-V semiconductors.

24. The method of claim 21 wherein the modified threshold voltage is greater or less than the original threshold voltage by at least 0.1 volt.

25. The method of claim 21 wherein the modified threshold voltage is greater or less than the original threshold voltage by at least 0.5 volt.

26. A computer readable medium having stored thereon, in a non-transitory manner, a plurality of software code portions defining logic for modifying a designed threshold voltage of a heterojunction field effect transistor by:
   a) being provided an original layout for an original heterojunction field effect transistor in dependence upon a provided circuit design for the original transistor, the original transistor having a first piezoelectric layer supporting a channel, a second piezoelectric layer over the first piezoelectric layer, an original dielectric layer divided by a gate opening, the original dielectric layer over the second piezoelectric layer, and an original gate disposed in the gate opening; and
   b) modifying the original layout to produce a modified layout by:
      i) replacing the original dielectric layer with a modified dielectric layer having a plurality of dielectric segments separated by a plurality of gaps, and
      ii) replacing the original gate with a modified gate, wherein the modified gate has a main body and a plurality of tines, the main body of the modified gate covering at least one dielectric segment of the plurality of dielectric segments and covering at least two gaps of the plurality of gaps, the plurality of tines having proximal ends connected to the main body of the modified gate, middle portions projecting through the plurality of gaps, and distal ends separated from the first piezoelectric layer by at least the second piezoelectric layer, each tine having a width, measured parallel to a direction of current flow in the channel, of less than 200 nm,
   wherein a modified heterojunction field effect transistor produced using the modified layout has a modified threshold voltage and the original heterojunction field effect transistor produced using the original layout has an original threshold voltage, the modified threshold voltage different from the original threshold voltage.

27. A field effect transistor comprising:
a first piezoelectric layer supporting a channel;
a second piezoelectric layer over the first piezoelectric layer;
a dielectric layer having a plurality of dielectric segments separated by a plurality of gaps,
   the dielectric layer over the second piezoelectric layer; and
a gate having a main body and two or more tines projecting from the main body, the tines disposed between the main body and the channel region, wherein a segment of the plurality of segments of the dielectric layer is disposed between one of the tines and an adjacent tine,
wherein each tine has a width, measured parallel to a direction of current flow in the channel, of less than about 200 nm.

28. The field effect transistor of claim 27 wherein the first piezoelectric layer is substantially a crystalline III-V semiconductor.

29. The field effect transistor of claim 27 wherein the second piezoelectric layer is substantially a crystalline III-V semiconductor.

30. The field effect transistor of claim 27 wherein the first piezoelectric layer and the second piezoelectric layer contact at a heterojunction.

31. The field effect transistor of claim 30 wherein the field effect transistor has a positive threshold voltage.

32. The field effect transistor of claim 30 wherein the field effect transistor has a negative threshold voltage.

33. The field effect transistor of claim 27 wherein the dielectric layer exerts tensile or compressive stress having absolute value greater than about 100 megapascals.

34. The field effect transistor of claim 27 further comprising
a source electrically coupled to the second piezoelectric layer; and
a drain electrically coupled to the second piezoelectric layer,
wherein the channel is non-conducting when there is a voltage difference between the source and the drain and there is no voltage applied between the gate and the source or the gate and the drain.

35. A method for designing an integrated circuit device, comprising:
using a computer system, providing a simulation model for a three-dimensional integrated circuit device implementing an integrated circuit design,
the integrated circuit device having a first piezoelectric layer supporting a channel, a second piezoelectric layer over the first piezoelectric layer, a dielectric layer having a plurality of dielectric segments separated by a plurality of gaps, the dielectric layer over the second piezoelectric layer, and a gate having a main body and two or more tines projecting from the main body, the tines disposed between the main body and the channel region, wherein a segment of the plurality of segments of the dielectric layer is disposed between one of the tines and an adjacent tine, wherein, in the first piezoelectric layer adjacent to the second piezoelectric layer, stress exerted by the dielectric layer creates a piezoelectric charge of at least about $1 \times 10^{11}$ per $cm^2$ of electronic charge; and
using the model to simulate an aspect of the integrated circuit design.

36. The method of claim 35 wherein the first piezoelectric layer and the second piezoelectric layer contact at a heterojunction.

37. The method of claim 35 wherein the first piezoelectric layer and the second piezoelectric layer are substantially III-V semiconductors.

38. The method of claim 35 wherein each tine has a width, measured parallel to a direction of current flow in the channel, of less than about 200 nm.

39. An electronic design automation (EDA) system having a processor and a non-transitory computer-readable storage medium storing first software code portions and second software code portions,
wherein the first software code portions, when executed by a processor, plan layout of a three-dimensional integrated circuit device implementing an integrated circuit design, the layout identifying:
a) a first piezoelectric layer supporting a channel,
b) a second piezoelectric layer over the first piezoelectric layer,
c) a dielectric layer having a plurality of dielectric segments separated by a plurality of gaps, and
d) a gate having a main body and two or more tines projecting from the main body, the tines disposed between the main body and the channel region, wherein a segment of the plurality of segments of the dielectric layer is disposed between one of the tines and an adjacent tine, wherein each tine has a width, measured parallel to a direction of current flow in the channel, of less than about 200 nm;
wherein the second software code portions, when executed by a processor, generate a data file to define a plurality of masks, the plurality of masks comprising:
a) a first mask used to pattern the plurality of dielectric segments and the plurality of gaps, and
b) a second mask used to pattern the gate.

40. The EDA system of claim 39 wherein the first piezoelectric layer and the second piezoelectric layer contact at a heterojunction.

41. The EDA system of claim 39 wherein the first piezoelectric layer and the second piezoelectric layer are substantially III-V semiconductors.

* * * * *